Nov. 22, 1966 A. HÄHNLEIN 3,287,506

SEMICONDUCTOR-BASED ELECTRO-ACOUSTIC TRANSDUCER

Filed Dec. 14, 1964

United States Patent Office 3,287,506
Patented Nov. 22, 1966

3,287,506
SEMICONDUCTOR-BASED ELECTRO-ACOUSTIC TRANSDUCER

Alfons Hähnlein, Nieder-Ramstadt, Germany, assignor to Siemens & Halske Aktiengesellschaft, Munich, Germany
Filed Dec. 14, 1964, Ser. No. 417,969
Claims priority, application Germany, Dec. 14, 1963, D 43,175
8 Claims. (Cl. 179—110)

From the very beginnings of semiconductor technology, attempts have repeatedly been made to develop a semiconductor device to be used as an electroacoustic transducer, in most cases as a microphone.

One such solution aims at having the distance separating the two point electrodes of a point-contact transistor, after these electrodes have been appropriately arranged between the diaphragms, varied by acoustic pressure in order to control the transistor (U.S. Patent 2,647,162).

Another solution proposes to change the reverse characteristics of an appropriately biased p-n junction by having suitably applied mechanical vibrations release holes (U.S. Patent 2,497,770).

A further solution is characterized by a dielectric layer arranged between a highly conductive control electrode and a semiconductor block consisting of various layers differing in conductivity. Here again control is effected by carrier generation in the barrier of a p-n junction (DAS 1,006,169).

Another known method consists in controlling a semiconductor amplified by changing the field strength, these changes being effected by suitably applied mechanical vibrations. In this connection use is made, for instance, of the charge-reversal effects of a mobile dielectric. Such devices invariably have to rely on a D.C. bias, a fact that greatly limits the field of application (German patent application S 24,334).

In contrast to the attempts that have become known so far, the invention uses a different way to solve the problem and avails itself of some new findings in semiconductor technology.

In recent literature a phenomenon has been described where the inversion zone in the semiconductor surface under a silicon dioxide layer deposited by planar techniques is subjected to the influence of an electric field applied to the silicon dioxide layer. If a p-n junction is located in the immediate vicinity, the change thus brought about can be measured by means of the changes in the saturation reverse current. These changes can also be brought about by applying an electric field to the oxide layer.

A method is already known by which this phenomenon is technically utilized for controlling a spatially limited inversion zone on the semiconductor surface, such zone being known as a channel. The device here referred to is a unipolar or field-effect transistor whose gate electrode is designed as a very highly resistive silicon dioxide electrode by means of which the channel is controlled (Proc. IEEE 51 (1963) 9, o.1190).

According to the invention a semiconductor-based electroacoustic transducer comprises a high-resistivity semiconductor block with a source electrode and a sink electrode, a spatially limited inversion zone (channel) in the semiconductor surface serving as a current path between said electrodes and a piezoelectric crystal at the inversion zone, electrostatic induction causing direct interaction between the size of said inversion zone and the electric field of the piezoelectric crystal.

According to one embodiment of the invention, a separate piezoelectric crystal is used, e.g. one of lead zirconate titanate.

According to a particularly efficient modification of the invention, a silicon dioxide layer (quartz) or a layer of some other known piezoelectric ceramic material such as barium titanate is epitaxially grown on a high-resistivity silicon semiconductor, the layer being metallized on its surface and carrying an electrode.

It is advantageous to connect the side of tthe piezoelectric crystal facing away from the semiconductor with the source electrode.

The electroacoustic transducer according to the invention is suitable both as a sound receiver and a sound generator.

The invention will now be more fully described in conjunction with exemplified embodiments thereof shown in the attached drawing.

Figure 1:
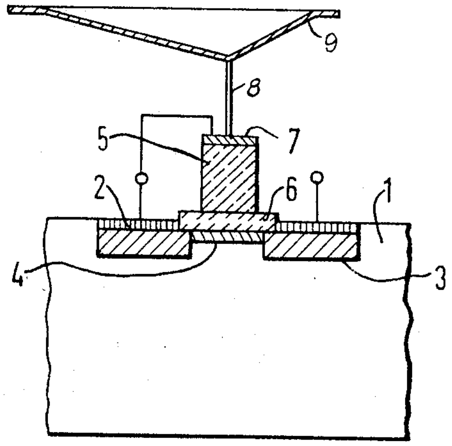
FIG. 1 is a view of one embodiment of the invention.

FIG. 1 shows the arrangement of a possible design of an electroacoustic transducer according to the invention. A semiconductor block 1 of intrinsic silicon has alloyed into it two barrier-free contacts which serve as source and sink electrodes for the majority carrier current flowing between the two electrodes in the spatially limited inversion zone 4 in the surface of the semiconductor. To this extent the design corresponds to that of a field-effect transistor. In contrast to known designs of such field-effect transistors, the device does not use a gate electrode to which a control voltage is applied, nor does it use a high-resistivity oxide electrode. The latter has been replaced by a piezoelectric crystal 5 whose charge acts upon the current path (channel) 4 by means of electrostatic induction, either directly or through a layer of amorphous silicon dioxide 6. The piezoelectric crystal is stimulated by conventional methods to vibrate mechanically, thus acting as a sound receiver, or converts, as a sound generator, electric charges into mechanical vibrations. The end of the piezoelectric crystal 5 facing away from the semiconductor is provided with a coating 7 and electrically connected with the source electrode 2. On account of the high piezoelectric voltages, it is recommendable to use some lead-ceramic material, such as lead zirconate titanate, for the piezoelectric crystal. To passivate the semiconductor surface, the thin amorphous layer 6 has been deposited by means of the wellknown planar techniques.

The piezoelectric crystal 5 is connected to a sound translating means consisting of a diaphragm 9, over a transmission linkage 8, which transmits the movements of the diaphragm to the crystal, or, when the apparatus is employed as a sound emitter, which linkage transmits the deformations of the crystal to the diaphragm.

Figure 2:
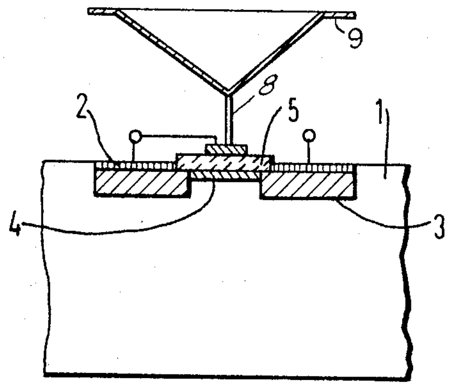
FIG. 2 is a view of a second embodiment of the invention.

FIG. 2 shows a particularly advantageous modification of the invention. As far as the field-effect transistor is concerned, it corresponds to the arrangement shown by FIG. 1. In this case, however, the silicon dioxide layer has been grown epitaxially. This means that, as a quartz layer, it already displays remarkable piezoelectric characteristics so that it may be utilized directly as a piezoelectric crystal 5. The principle of operation of this arrangement is based, like that of FIG. 1, on direct interaction by electrostatic induction between the piezoelectric field and the spatially limited inversion zone.

It goes without saying that the mode of operation of the devices described in the foregoing may also be reversed so that they act as sound generators. In this case a voice frequency is applied to the semiconductor 1 via the source electrode 2 and causes, by electrostatic induction through the spatially limited inversion zone 4, changes in the charge of the piezoelectric crystal 5. The changing charge in turn causes the piezoelectric crystal 5 to contract and expand.

The transconductance of the field-effect transistor so far developed, which have a gate electrode in the silicon dioxide, is between 2 and 5 mA./v. The piezoelectric sensitivity of the piezoelectric crystals, particularly of those made of lead-ceramic material, exceeds 100 v. mm./kg.

An effective control area of $10^{-6}$cm.$^2$ and an acoustic pressure of 1 dyn./cm.$^2$ ensure that the field-effect transistor is driven to a sufficiently high output.

The principle of the invention may be applied to all types of field-effect transistors including the recently developed TFT transistors, i.e. thin-film unipolar transistors using, for instance, cadmium sulfide as a semiconductor (cf., for instance, Proc. IEEE November 1963, pp. 1642).

A field-effect transistor designed as an electric-acoustic transducer in accordance with the principle of the invention has an input of very high impedance and an output of comparatively low impedance, that is to say, it is suitable to operate into transistor amplifiers using bipolar transistors.

I claim:

1. A semiconductor-based electroacoustic transducer comprising a high-resistivity semiconductor block having a source electrode and a sink electrode spaced apart thereon, the semiconductor having a spatially limited variable cross section current channel in the semiconductor surface serving as a current path between said electrodes, a piezoelectric crystal so mounted adjacent the inversion zone that electrostatic induction causes direct interaction between the size of said current channel and the electric field of the piezoelectric crystal, and sound translating means connected to said crystal and operable to do one of: (*a*) translate sound vibrations into force variations exerted on said crystal; and, (*b*) translate variations in the size of said current channel into sound vibrations.

2. The transducer of claim 1 in which the piezoelectric crystal is a separate one, for example of lead zirconate titanate.

3. The transducer of claim 1 in which the piezoelectric crystal is a silicon dioxide layer epitaxially grown on a high-resistivity silicon semiconductor.

4. The transducer of claim 1 in which the piezoelectric crystal is a layer of piezoelectric ceramic material, for example barium titanate epitaxially grown on a semiconductor.

5. The transducer of claim 1 in which the surlace of the piezoelectric crystal is metallized and carries an electrode.

6. The transducer of claim 1 in which the side of the piezoelectric crystal facing away from the semiconductor is electrically connected with the source electrode.

7. The transducer of claim 1 serving as a sound receiver.

8. The transducer of claim 1 serving as a sound generator.

References Cited by the Examiner

UNITED STATES PATENTS 2,898,477 8/1959 Hoesterey.

KATHLEEN H. CLAFFY, *Primary Examiner.*

F. N. CARTEN, *Assistant Examiner.*